United States Patent [19]

Fukushima et al.

[11] 4,256,975
[45] Mar. 17, 1981

[54] LIMITER CIRCUIT FOR REMOVING NOSE FROM DEMODULATED SIGNALS

[75] Inventors: Isao Fukushima, Katsuta; Hiroyuki Kimura, Yokohama; Hideo Nishijima, Katsuta, all of Japan

[73] Assignee: Hitachi, Ltd., Japan

[21] Appl. No.: 964,796

[22] Filed: Nov. 30, 1978

[30] Foreign Application Priority Data

Nov. 30, 1977 [JP] Japan .................................. 52/142613

[51] Int. Cl.³ .............................................. H04B 1/10
[52] U.S. Cl. .................................... 307/543; 328/165; 328/171; 329/134; 455/309
[58] Field of Search ........... 329/134, 203, 204, 205 R; 307/237; 328/165, 169, 171; 325/473, 480, 482; 455/308, 309

[56] References Cited

U.S. PATENT DOCUMENTS

| | | | |
|---|---|---|---|
| 2,861,185 | 11/1958 | Hopper | 328/171 |
| 2,931,901 | 4/1960 | Markusen | 328/171 X |
| 3,344,284 | 9/1967 | Thompson | 307/237 |
| 3,541,459 | 11/1970 | Webb et al. | 307/237 X |

Primary Examiner—Siegfried H. Grimm
Attorney, Agent, or Firm—Craig & Antonelli

[57] ABSTRACT

A diode limiter circuit comprising a low-pass filter for suppressing noise pulses superposed on a demodulated signal and for passing only the noise-suppressed demodulated signal, and a circuit means including limiter diodes whose conduction starting levels are varied according to the waveform of the demodulated signal by superposing the noise-suppressed demodulated signal having passed through the low-pass filter on voltage sources for determining the current conduction starting levels of the limiter diodes to attenuate in a shunting manner the noise pulses exceeding in amplitude of the current conduction starting levels of the limiter diodes.

9 Claims, 12 Drawing Figures

FIG.1
PRIOR ART
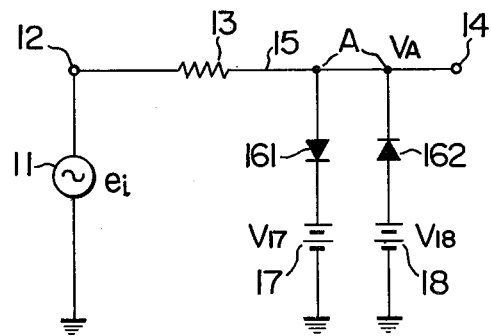
FIG.2A
PRIOR ART
FIG.2B
PRIOR ART
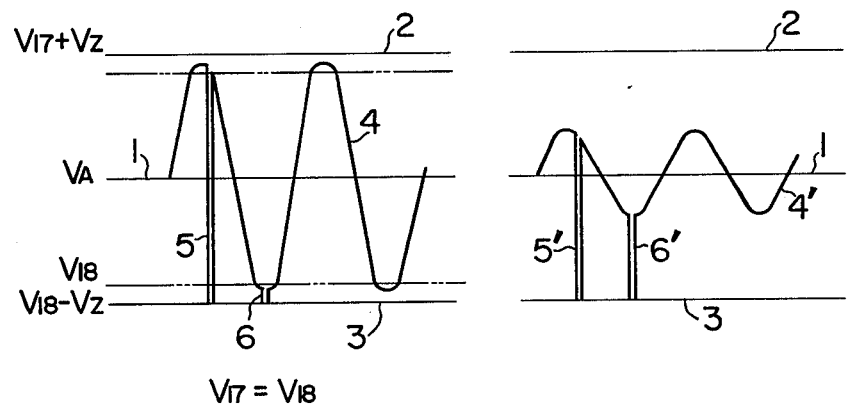
$V_{17} = V_{18}$ $|V_{Z161}|=|V_{Z162}|$

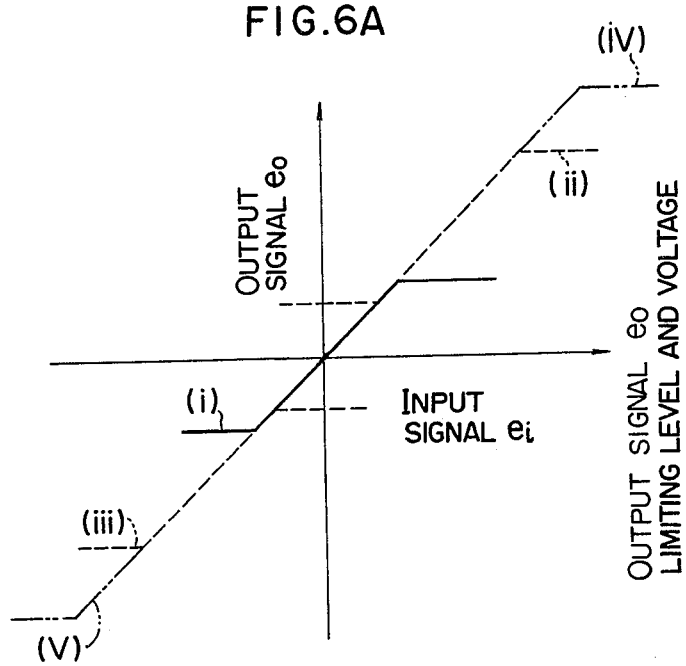
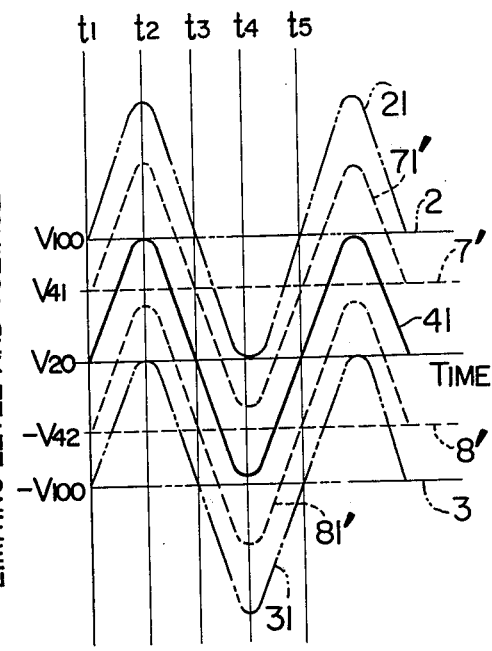
FIG.6A
FIG.6B
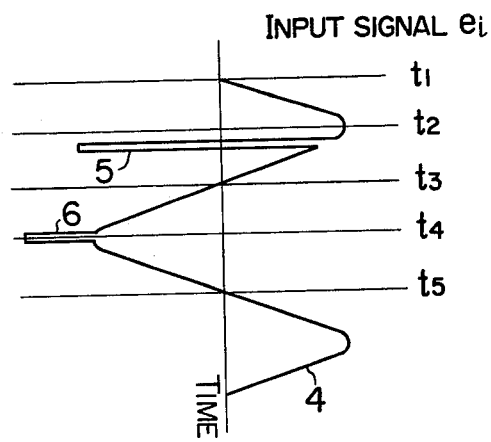
FIG.6C
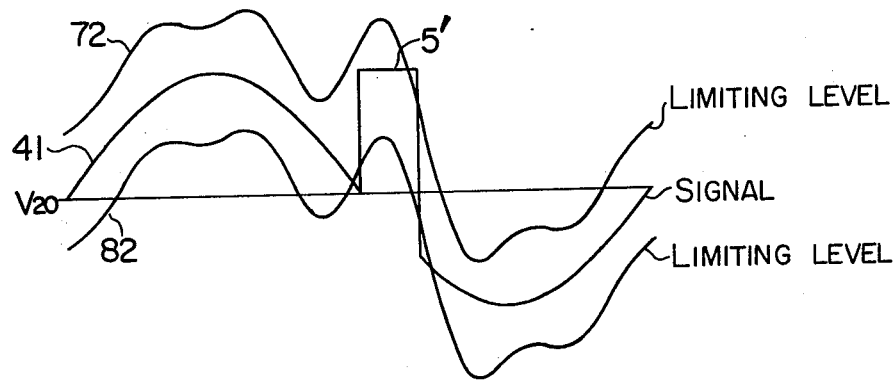
FIG.7

LIMITER CIRCUIT FOR REMOVING NOSE FROM DEMODULATED SIGNALS

BACKGROUND OF THE INVENTION

1. FIELD OF THE INVENTION

This invention relates to a limiter circuit adapted for use in a radio receiver mounted on a car or in a CB transceiver, which can suppress pulsating noise superposed on a demodulated signal.

2. DESCRIPTION OF THE PRIOR ART

A radio receiver mounted on a car or a CB transceiver is liable to pick up pulsating noise generated by the internal combustion engine.

In general, therefore, such a car-mounted device has a limiter circuit for suppressing pulsating noise provided in its receiving circuit.

Such a limiter circuit as currently used in the fields of the art, is shown in FIG. 1. Namely, an inverse parallel circuit of a series connection of a limiting diode 161 and an associated bias source 17 for determining the conduction starting voltage of the diode 161, i.e. one limiting level, and a series connection of a limiting diode 162 and an associated bias source 18 for determining the conduction starting voltage of the diode 162, i.e. the other limiting level, is connected between the earth and a demodulated signal transmission line 15 for transmitting a demodulated signal (or a modulated signal) $e_i$ received at an input terminal 12 to an output terminal 14 through a signal source resistor 13. In case of reception, the diodes 161 and 162 are inversely biased to their cut-off states under the control of the bias sources 17 and 18 so that if the pulsating noise superposed on the demodulated signal $e_i$ exceeds the level of, for example, 100% AM modulation, the noise may turn the diodes 162 and 161 conductive. Accordingly, the pulsating noise exceeding the level of 100% AM modulation is short-circuited to the earth through the diodes 161 and 162.

FIGS. 2A and 2B show waveforms useful in explaining the limiter operation described above. In the figures, reference numeral 1 indicates a dc voltage $V_A$ corresponding to the reference level in the absence of modulation, derived at the junction point A of the demodulated signal transmission line 15 and the limiting diode 161 or 162; 2 a limiting level defined by the sum $(V_{17}+V_Z)$ of the bias voltage $V_{17}$ of the bias source 17 and the threshold voltage $V_Z$ of the limiting diode 161; 3 a limiting level defined by the difference $(V_{18}-V_Z)$ between the bias voltage $V_{18}$ of the bias source 18 and the threshold voltage $V_Z$ of the limiting diode 162; 4 a waveform of a demodulated signal with its AM carrier of 100% modulation; 5 and 6 noise pulses superposed on the demodulated signal waveform 4; 4' a waveform of a demodulated signal with its AM carrier of less than 100% modulation; and 5' and 6' noise pulses superposed on the demodulated signal waveform 4'.

However, the limiting effect of such a limiter circuit with constant limiting levels as described above varies largely depending on the positions in which the noise pulses are superposed on the demodulated signal, that is, whether the positions are at the peaks of the demodulated signal or at the throughs of the signal, or depending on the degree of modulation of a signal to be demodulated. Thus, the limiter circuit cannot provide its highest possible performance. Namely, assuming that the limiting levels are so set as indicated at straight lines 2 and 3 in FIGS. 2A and 2B, the noise pulses 5' and 6' remain large as compared with the demodulated signal waveform 4', in case of low degree of modulation as shown in FIG. 2B, to remarkably degrade the limiting effect, while the noise pulses 5 and 6 can be effectively suppressed as compared with the demodulated signal waveform 4 in case of high degree of modulation as shown in FIG. 2A.

If the inverse biases to the diodes 161 and 162 by the bias sources 17 and 18 are decreased to decrease the limiting range between the limiting levels for the purpose of improving the limiting effect in case of low degree of modulation, the demodulated signal waveform in case of high degree of modulation is also clipped so that the signal waveform is distorted.

SUMMARY OF THE INVENTION

An object of this invention is to provide a limiter circuit having an excellent effect of suppressing noise pulses superposed on a demodulated signal.

According to this invention, which has been made to attain the above object, there are provided a limiter connected in the demodulated signal transmission line for transmitting the demodulated signal received at the demodulated signal input terminal to the demodulated signal output terminal, and a circuit means for extracting the demodulated signal received at the demodulated signal input terminal and for attenuating and eliminating higher harmonic components such as noise pulses superposed on the demodulated signal whereby the limiting level of the limiter may be so controlled as to vary following the waveform of the demodulated signal by superposing the demodulated signal with its higher harmonics eliminated on the bias source for the limiter.

BRIEF DESCRIPTION OF THE DRAWINGS

FIG. 1 shows a circuit of the conventional diode limiter.

FIGS. 2A and 2B show waveforms useful in explaining the operation of the circuit of FIG. 1.

FIGS. 6A to 6C respectively show input-output characteristics and the limiter characteristics of the circuit shown in FIG. 5.

FIG. 7 shows waveforms useful in explaining the effect of this invention.

DESCRIPTION OF THE PREFERRED EMBODIMENTS

Figure 3:
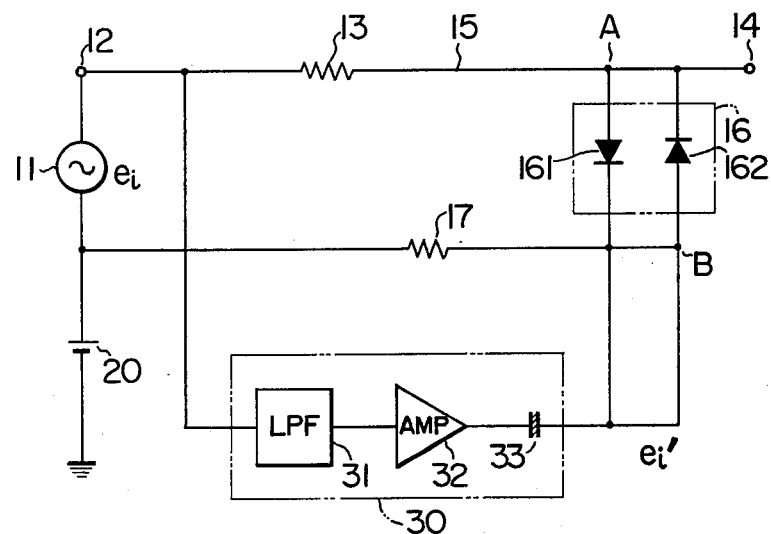
FIG. 3 shows a circuit of a diode limiter as an embodiment of this invention.

This invention will be described below by way of embodiment with the aid of the attached drawings. FIG. 3 shows a circuit of a diode limiter as an embodiment of this invention. The same reference numerals and symbols are attached to equivalent circuit elements in FIGS. 1 and 3. Reference numeral 11 indicates a demodulated signal source representative of a demodulated signal $e_i$; 12 an input terminal for receiving the signal $e_i$ from the source 11; 13 a signal source resistor; 14 an output terminal for delivering a demodulated signal; 15 a demodulated signal transmission line for transmitting the signal $e_i$ received at the input terminal 12 to the output terminal 14 through the signal source resistor 13; and 16 a limiter connected with the junction point A of the signal source resistor 13 of the transmission line 15 and the output terminal 14. The limiter 16 consists of a pair of inversely parallel connected diodes 161 and 162 having the same threshold voltage serving as the reference limiting level in the absence of modulation. The anode of the limiter diode 161 and the cathode of the limiter diode 162 are both connected with the junction point A of the demodulated signal transmission line while the cathode of the limiter diode 161 and the anode of the limiter diode 162 are grounded through the resistor 17 and the anode-cathode path of a bias power source 20. The positive electrode of the bias source 20 is connected with the input terminal through the demodulated signal source 11. Accordingly, since the dc voltage developed between the junction points A and B of the limiter diodes 161 and 162 is supplied by the bias source 20, the limiter diodes 161 and 162 are inversely biased by a voltage equal to the same threshold voltage, i.e. conduction starting voltage, of the diodes themselves. The inverse bias voltage is, for example, about 0.15 V where the diodes 161 and 162 are made of germanium and about 0.75 V where they are of silicon. The limiting level of the limiter is determined by the threshold voltage. A dc source for the demodulating circuit (not shown) in the next preceding stage to the circuit shown in FIG. 3 may be used as the bias source 20. Reference numeral 30 designates a control circuit which is connected between the input terminal 12 and the limiter 16 so as to control the limiting level of the limiter 16 in such a manner that the limiting level varies following the waveform of the demodulated signal received at the input terminal 12. The control circuit 30 comprises a low-pass filter 31, an amplifier, e.g. an emitter-follower type buffer amplifier 32, and a direct current blocking capacitor 33, the circuit elements 31, 32 and 33 being connected in series. The low-pass filter 31 is connected with the input terminal 12 so as to extract the demodulated signal received at the input terminal, to eliminate higher harmonic components such as noise pulses superposed on the demodulated signal and to pass the demodulated signal alone. The amplifier 32 has a low output impedance and is connected between the low-pass filter 31 and the dc blocking diode 33 connected with the junction point B of the cathode of the limiter diode 161 and the anode of the limiter diode 162, so as to supply the signal passed through the low-pass filter 31 to the limiter diodes 161 and 162 and to attenuate in a shunting manner the noise pulses superposed on the demodulated signal when they exceed the limiting levels of the limiter diodes 161 and 162. The amplifier 32 is provided especially for effectively attenuating the noise pulses passing through the limiter diodes 161 and 162. Therefore, the control circuit 30 may dispense with the amplifier 32 as well as the capacitor 33. If the amplifier 32 and the capacitor 33 are eliminated, it is only necessary to disconnect the resistor 17, to connect the output of the low-pass filter 31 directly with the limiter diodes 161 and 162 and to supply the voltage from the bias source 20 to the junction point B through the low-pass filter 31.

Figure 4A:
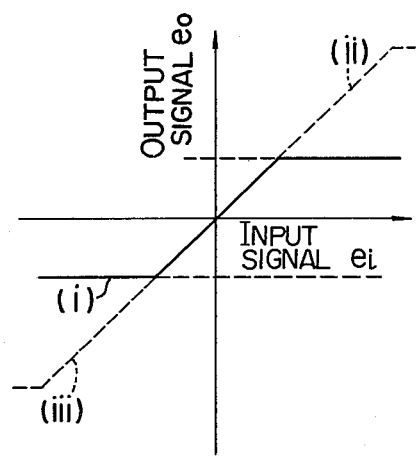
FIGS. 4A and 4C respectively show input-output characteristics and the limiter characteristics of the circuit shown in FIG. 3.
Figure 4B:
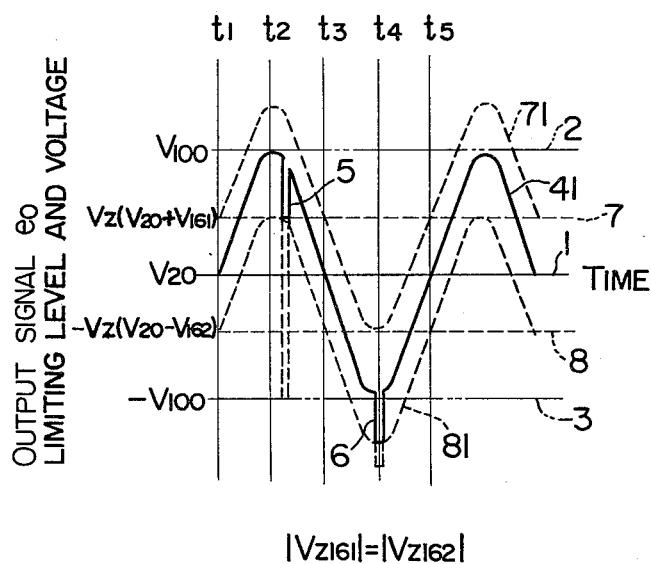
Figure 4C:
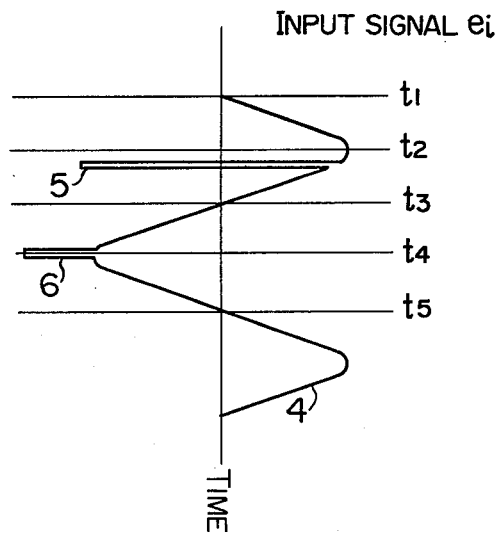

When a demodulated signal waveform 4 ($e_i$) with noise pulses 5 and 6 superposed thereon as shown in FIG. 4C is received at the input terminal 12 of the circuit shown in FIG. 3, the input-output characteristics of the limiter diodes 161 and 162 are as shown in FIG. 4A and the output waveforms and the limiting characteristics of the diodes 161 and 162 are as shown in FIG. 4B.

Namely, as shown in FIGS. 4B and 4C, the input signal $e_i$ received at the input terminal 12 and the output control signal $e'_i$ of the limiting level control circuit 30 become both zero at an instant $t_1$. At this time, the conduction starting voltages $V_Z$, i.e. limiting levels, of the limiter diodes 161 and 162 are respectively $V_{20}+V_{161}$ and $V_{20}-V_{162}$, where $V_{161}$ and $V_{162}$ ($V_{161}=V_{162}$) are the threshold voltages of the diodes 161 and 162, and $V_{20}$ is the voltage of the bias source 20. The output characteristic of the limiter 16 is therefore symmetric with respect to the origin, as shown in FIG. 4A. Accordingly, the limiting levels 7 and 8 are determined for the output waveform 41 at the instant $t_1$, as shown in FIG. 4B.

As shown with the input waveform 4 in FIG. 4C, at instants $t_2$ and $t_4$, the input signal $e_i$ and the control signal $e'_i$ take respectively the positive and negative extreme values. At these instants, therefore, a signal voltage $$V_{20}+v_i(t)+v_n(t)$$

is applied to the junction point A of the diodes 161 and 162, where $v_i(t)$ is the input signal voltage and $v_n(t)$ is the noise voltage, while a control signal voltage $$V_{20}+v_i(t)$$

is applied to the junction point B of the diodes 161 and 162. Accordingly, the conduction starting voltages $\pm V_Z$ of the limiter diodes 161 and 162, i.e. the above defined limiting levels 7 and 8, vary as represented by curves 71 and 83 in FIG. 4B in accordance with these signal voltages. Even in this case, the limiting width defined between the varying limiting levels 71 and 78 is equal to the limiting width defined between the stationary limiting levels 7 and 8. Therefore, the limiter diode 161 conducts current if $V_{20}+v_i(t)+v_n(t)>V_{20}+V'_Z+v_i(t)$, where $V'_Z$ is the varying conduction-starting voltage of the diode 161, that is, if the noise voltage $v_n(t)$ exceeds the varying conduction-starting voltage $V'_Z$. On the other hand, the limiter diode 162 turns conductive if $V_{20}+v_i(t)+v_n(t)<V_{20}-V'_Z+v_i(t)$, where $-V'_Z$ is the varying conduction-starting voltage of the limiter diode 162, that is, if the noise voltage $v_n(t)$ becomes less than the varying conduction-starting voltage $-V'_Z$. Thus, the noise component $v_n(t)$ is attenuated. The degree or amount of attenuation of the noise voltage $v_n(t)$ is determined by the internal resistances of the limiter diodes 161 and 162, the resistance value of the signal source resistor 13 and the output impedance of the amplifier 32.

To sum up, the input-output characteristics of the limiter diodes 161 and 162 vary, at the instants $t_2$ and $t_4$, as represented respectively by curves (ii) and (iii) in FIG. 4A and the limiting levels 71 and 81 thereof correspondingly vary following the waveform 4 of the input signal $e_i$ as shown in FIG. 4B. Accordingly, the limiting levels 71 and 81 are determined for the output waveform 41 at the instants $t_2$ and $t_4$.

As described above, according to this invention, the limiting levels 71 and 81 of the limiter diodes 161 and 162 are so controlled as to vary following the input signal waveform 4 so that noise pulses 5 and 6 can be suppressed to a considerable extent. The especially notable feature of this invention is the capability of variable control, that is, that the limiting levels 71 and 81 can be varied up to and even above the level of the bias source voltage $V_{20}$, as seen from FIG. 4B. This leads readily to the fact that the noise pulses can be more effectively suppressed. To make the control of the limiting levels 71 and 81 variable up to the level of the bias source voltage $V_{20}$, it is only necessary to set the conduction starting voltages $+V_Z$ and $-V_Z$ of the limiter diodes 161 and 162 between the level 2 of the positive peak voltage $+V_{100}$ of the AM signal with 100% modulation and the level of the bias source voltage $V_{20}$ and between the level 3 of the negative peak voltage $-V_{100}$ of the AM signal and the level of the voltage $V_{20}$, respectively.

The setting of the voltages $\pm V_Z$ will be further detailed in the explanation of another embodiment of this invention given later.

Figure 5:
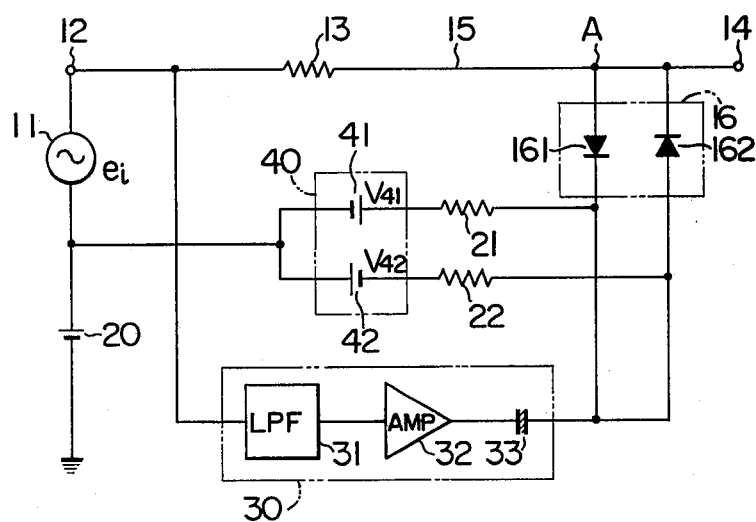
FIG. 5 shows a circuit of a diode limiter as another embodiment of this invention.

FIG. 5 shows a circuit of a diode limiter as another embodiment of this invention, in which an offset power source circuit 40 for determining the offset levels (i.e. limiting levels) of the limiter diodes 161 and 162 is provided between the limiter 16 and the bias source 20. The offset power source circuit 40 comprises an offset power source 41 for determining the offset level of the limiter diode 161 and an offset power source 42 for determining the offset level of the limiter diode 162. The negative electrode of the offset power source 41 and the positive electrode of the offset power source 42 are both connected with the positive electrode of the bias source 20. The positive electrode of the offset power source 41 is connected with the cathode of the diode 161 through a bias resistor 21 while the negative electrode of the offset power source 42 is connected with the anode of the diode 162 through a bias resistor 22. The other parts of the circuit, which are the same as those of the circuit shown in FIG. 3, are indicated by the same reference symbols and the explanation thereof is omitted here to avoid redundancy.

The limiting levels of such a limiter circuit as shown in FIG. 5 are determined by the offset power sources 41 and 42. Now, let it be assumed that the voltages of the offset power sources 41 and 42 are set equal respectively to $V_{41}$ and $V_{42}$ ($V_{41} = V_{42}$) and that the limiting levels of the limiter diodes 161 and 162 in the absence of modulation are set equal respectively to the levels $V_{100} \mp V_{41}$ and $V_{100} \mp V_{42}$, i.e. the levels 2 and 3 coincident with the peak voltages $V_{100}$ and $-V_{100}$ of the output AM signal 41 with 100% modulation. Then, when the input signal waveform 4 shown in FIG. 6C is received at the input terminal 12, the input-output characteristics of the limiter diodes 161 and 162 become as represented by curves (iv) and (v) in FIG. 6A while the limiting levels of the diodes 161 and 162 vary as represented by curves 21 and 31 in FIG. 6B, the output signal 41 being delivered within the range between the limiting levels 21 and 31. Thus, if the limiting levels are set coincident with the peak voltages $V_{100}$ and $-V_{100}$ of the AM signal with 100% modulation, the limiting levels are the maximum ones capable of reaching the level of the bias source voltage $V_{20}$. To make the limiting action more effective, it is necessary to lower the limiting levels toward the bias source voltage level $V_{20}$, and in an ideal case the limiting levels should be set coincident with the bias power source voltage level $V_{20}$. In practice, however, since the noise pulses contain also components passing through the low-pass filter 31, that is, since the complete elimination of pulsating noise by means of the low-pass filter 31 is impossible, the limiting levels do not vary analogous to the waveform of the demodulated signal $e_i$, but change as represented by curves 72 and 82 in FIG. 7. The waveforms of the varying limiting levels 72 and 82 appear rather deformed in comparison with the output demodulated signal 41. The distortion causes the portion of the signal 41 other than the noise pulses to be clipped so that the normal signal portion will be distorted, too. This is an unwanted result to be avoided.

In FIG. 7, reference numeral 41 indicates the output AM signal with 100% modulation; 5' a noise pulse having a pulse duration of 1 msec., superposed on the signal 41; and 72 and 82 the varying limiting levels.

To choose the limiting levels in such a manner that the output signal is not distorted, it is necessary to use as the low-pass filter 31 an ideal filter having a pass band of 0-3 KHz to obtain noise components containing frequencies up to 3 KHz by expanding the noise pulses in Fourier series and to set the offset levels at about 70% of the demodulated signal $e'_i$ by controlling the voltages of the offset power sources 41 and 42.

As described above, according to this invention, the noise pulses superposed on the demodulated signal can be effectively eliminated by setting the limiting levels of the limiter between the positive and negative peak voltage levels of the AM signal with 100% modulation and the offset levels corresponding to about 70% of the demodulated signal. This setting of the limiting levels is especially effective for the elimination of noise pulses superposed on the demodulated signal in its troughs.

We claim:

1. A limiter circuit comprising; a limiter including limiter diodes in inverse parallel connection, having reference limiting levels and having one end connected with a demodulated signal transmission line; circuit means for conducting AC components exceeding said limiting levels to the ground, said transmission line serving to transmit a demodulated signal supplied to a demodulated signal input terminal to a demodulated signal output terminal; wherein the limiter circuit further comprises:

a bias source having its one end grounded; first and second means for connecting the other end of said bias source to said one end and the other end of said limiter, respectively, and a limiting level control circuit including a low-pass filter for receiving a portion of said demodulated signal which may contain noise components from said input terminal and producing therefrom a noise-suppressed demodulation signal and means for supplying said noise-suppressed demodulation signal to said other end of said limiter, thereby varying the limiting levels of said limiter according to the waveform of said demodulated signal.

2. A limiter circuit as claimed in claim 1, wherein said limiter connected between said transmission line and said bias source includes first and second limiter diodes having threshold voltages serving as said reference limiting levels, the first junction point of said first and second limiter diodes being connected with said transmission line while the second junction point of said first and second limiter diodes is connected with said other end of said bias source and wherein said limiting level control circuit is connected between said input terminal and said second junction point of said first and second limiter diodes for supplying said noise-suppressed demodulation to said second junction point of said first and second limiter diodes.

3. A limiter circuit comprising; a limiter including limiter diodes in inverse parallel connection, having reference limiting levels and having one end connected with a demodulated signal transmission line; circuit means for conducting AC components exceeding the limiting levels to the ground with said transmission line serving to transmit a demodulated signal supplied to a demodulated signal input terminal to a demodulated signal output terminal, wherein the limiter circuit further comprises:

a bias source having its one end grounded; means for electrically connecting the other end of said bias source to said input terminal; an offset power source circuit connected between the other end of said limiter and said other end of said bias source for establishing together with said bias source the bias to said limiter and for establishing the limiting levels of said limiter; and a limiting level control circuit connected between said input terminal and the junction point of said limiter and said offset power source circuit for removing such AC components as noise superposed on said demodulated signal supplied to said input terminal to produce a noise-suppressed demodulation signal and for supplying said noise-suppressed demodulation signal to said limiter, thereby varying said limiting levels of said limiter following the waveform of said demodulated signal.

4. A limiter circuit as claimed in claim 3, wherein said limiter includes first and second limiter diodes connected between said transmission line and said offset power source circuit, with the first and second junction points of said first and second limiter diodes connected respectively with said transmission line and said offset power source circuit;

said offset power source circuit includes a first offset power source for determining the limiting level of said first limiter diode and a second offset power source for determining the limiting level of said second limiter diode, the positive electrode of said first offset power source and the negative electrode of said second offset power source being connected in common with said second junction point of said first and second limiter diodes while the negative electrode of said first offset power source and the positive electrode of said second offset power source are connected in common with said bias power source; and said limiting level control circuit includes therein a low-pass filter connected between said input terminal and said second junction point of said first and second limiter diodes, said low-pass filter removing such higher harmonic components as noise superposed on said demodulated signal received at said input terminal to produce a noise-suppressed demodulation signal and supplying said noise-suppressed demodulation signal to said first and second limiter diodes.

5. A limiter circuit comprising:
a first circuit means connected between a transmission line for transmitting a demodulated signal received at a demodulated signal input terminal to a demodulated signal output terminal and the ground, said first circuit means including a series circuit of a limiter and a bias source, said limiter having reference limiting levels defined by said bias source and suppressing the transmission of that part of said demodulated signal which exceeds said reference levels; a second circuit means for connecting the junction point of said bias source and said limiter with said input terminal; and a control circuit means including a third circuit means connected with said input terminal, for eliminating such higher harmonic components as noise pulses superposed on said demodulated signal received at said input terminal and for passing only the demodulated signal free from said noise pulses, and a fourth circuit means for connecting said third circuit means with said limiter so as to supply the output of said third circuit means to said limiter and for attenuating the signal exceeding in amplitude said reference limiting levels of said limiter by shunting said signal to the ground, said control circuit means causing said reference limiting levels of said limiter to vary following the waveform of the signal having passed through said third circuit means.

6. A limiter circuit as claimed in claim 5, wherein said limiter includes first and second limiter diodes having threshold voltages serving as said reference limiting levels, said first and second limiter diodes being connected in inverse parallel configuration between said transmission line and said bias power source;

said third circuit means is a low-pass filter connected with said input terminal; and said fourth circuit means is connected between said low-pass filter and said limiter and includes a series circuit of a capacitor for blocking direct current and an amplifier, for supplying the output signal of said low-pass filter to said limiter and for attenuating in shunting manner those noise pulses superposed on said demodulated signal received at said input terminal which exceed in amplitude said limiting levels of said first and second limiter diodes.

7. A limiter circuit comprising:
a first circuit means connected between a demodulated signal transmission line for transmitting a demodulated signal received at a demodulated signal input terminal to a demodulated signal output terminal and the ground, said first circuit means including a series circuit of a limiter and a bias power source and an offset power source circuit for determining together with said bias power source the bias of said limiter and also for determining the limiting levels of said limiter; a second circuit means for connecting the junction point of said bias power source and said limiter with said input terminal; and a control circuit means including a third circuit means connected with said input terminal, for eliminating such higher harmonic components as noise pulses superposed on said demodulated signal received at said input terminal and for passing only the demodulated signal free from said noise pulses, and a fourth circuit means for connecting said third circuit means with said limiter so as to supply the output of said third circuit means to said limiter and for attenuating the signal exceeding in amplitude said reference limiting levels of said limiter by shunting said signal to the ground, said control circuit means causing said reference limiting levels of said limiter to vary according to the waveform of the signal having passed through said third circuit means.

8. A limiter circuit as claimed in claim 7, wherein said limiter comprises first and second limiter diodes connected in inverse parallel configuration between said transmission line and said offset power source circuit, with the first and second junction points of said first and second limiter diodes connected respectively with said transmission line and said offset power source circuit;

said offset power source circuit includes a first offset power source for determining the limiting level of said first limiter diode and a second offset power source for determining the limiting level of said second limiter diode, the positive electrode of said first offset power source and the negative electrode of said second offset power source being connected in common with said second junction point of said first and second limiter diodes while the negative electrode of said first offset power source and the positive electrode of said second offset power source are connected in common with said bias power source;

said third circuit means is a low-pass filter connected with said input terminal; and said fourth circuit means is connected between said low-pass filter and said limiter and includes a series circuit of a capacitor for blocking direct current and an amplifier, for supplying the output signal of said low-pass filter to said limiter and for attenuating in shunting manner those noise pulses superposed on said demodulated signal received at said input terminal which exceed in amplitude said limiting levels of said first and second limiter diodes.

9. A limiter circuit having a limiter including first and second limiter diodes connected in inverse parallel configuration with a demodulated signal transmission line for transmitting a demodulated signal received at a demodulated signal input terminal to a demodulated signal output terminal, said limiter circuit comprising:

a bias power source and an offset power source circuit connected between said limiter and the ground, said offset power source circuit including a first offset power source connected between said bias power source and said first limiter diode for determining the conduction starting voltage as the reference limiting level of said first limiter diode and a second offset power source connected between said bias power source and said second limiter diode for determining the conduction starting voltage as the reference limiting level of said second limiter diode;

a circuit means for connecting the junction point of said bias source and said offset power source circuit with said input terminal;

a low-pass filter connected with said input terminal for extracting said demodulated signal received at said input terminal and for eliminating noise pulses superposed on said demodulated signal so as to pass only said demodulated signal; and a series circuit of a capacitor for blocking direct current and an amplifier, for supplying the output of said low-pass filter to the junction point of said offset power sources and said limiter diodes so as to superpose said output of said filter on the offset voltages of said offset power sources and for attenuating in shunting manner the noise pulses exceeding in amplitude said reference limiting levels of said first and second limiter diodes.

* * * * *